United States Patent [19]
Johnson

[11] Patent Number: 4,618,786
[45] Date of Patent: Oct. 21, 1986

[54] PRECHARGE CIRCUIT FOR ENHANCEMENT MODE MEMORY CIRCUITS

[75] Inventor: Mark G. Johnson, Sunnyvale, Calif.

[73] Assignee: Thomson Components - Mostek Corporation, Carrollton, Tex.

[21] Appl. No.: 640,276

[22] Filed: Aug. 13, 1984

[51] Int. Cl.$^4$ .................. H03K 17/06; H03K 19/096
[52] U.S. Cl. .................. 307/578; 307/200 B; 307/481; 307/482; 307/579; 307/269; 307/594; 307/606
[58] Field of Search .................. 307/200 B, 443, 448, 307/452, 453, 572, 480–482, 577–579, 582–583, 269, 592, 594–595, 605–606; 365/194, 203

[56] References Cited

U.S. PATENT DOCUMENTS

| | | | |
|---|---|---|---|
| 3,866,061 | 2/1975 | Wen et al. | 365/194 X |
| 4,289,973 | 9/1981 | Eaton, Jr. | 307/443 X |
| 4,360,901 | 11/1982 | Proebsting | 365/203 X |
| 4,401,904 | 8/1983 | White, Jr. et al. | 307/482 |
| 4,521,701 | 6/1985 | Reddy | 307/443 X |
| 4,550,264 | 10/1985 | Takahaski et al. | 307/482 X |

OTHER PUBLICATIONS

Hultman, "Memory Clock Design", *IBM T.D.B.*, vol. 9, No. 10, Mar. 1967, pp. 1328–1329.

*Primary Examiner*—Stanley D. Miller
*Assistant Examiner*—D. R. Hudspeth
*Attorney, Agent, or Firm*—Roland Plottel

[57] ABSTRACT

A circuit for precharging the gates of pass transistor that will be subsequently bootstrapped employs a precharge circuit that generates a precharge pulse having magnitude greater than Vcc and distributes the pulse to a number of gate control circuits that raise the pass transistor gate voltages from a quiescent voltage level of Vcc-Vt to Vcc at a time before the bootstrapping signals arrive at the pass transistor.

3 Claims, 3 Drawing Figures

PRECHARGE CIRCUIT FOR ENHANCEMENT MODE MEMORY CIRCUITS

TECHNICAL FIELD

The field of the invention is that of enhancement mode memory circuits, in particular dynamic random access memory circuits.

BACKGROUND ART

Designers of integrated circuits constantly strive to extend the voltage range within which the circuit will operate. In the case of circuits constructed only with enhancement mode transistors, extension to low values of the supply voltage is restricted, among other things, by the inability of transistors to turn on sufficiently hard to function properly. In particular, memory circuits use many "bootstrapped" transistors in which the gate of a pass transistor is capacitively boosted to a value above the supply voltage. Since enhancement mode transistors typically are limited to an output that is one threshold voltage below the supply voltage, a circuit that employs only enhancement mode transistors will have more difficulty in coping with a low value of the supply voltage than will a circuit in which depletion mode transistors are available.

In the prior art, a particular limiting factor in the extension of the voltage range to low values has been that of the critically important bootstrapped gate nodes of pass transistors—in particular the Row Select circuit. As the supply voltage (Vcc) drops, this circuit typically fails in conventional prior art circuits at a supply voltage approximately equal to three times the value of the threshold voltage (Vt) that is used in the circuit. In the prior art circuit of FIG. 1, the voltage on gate 11 is precharged to the value Vcc at the end of a memory cycle, by a suitable pulse (greater than Vcc) on gate 22, and then leaks down at a rate set by the stray capacitance and the leakage impedance. If the interval between memory accesses is long, the precharge circuit 20 will effectively not be present.

If it could be guaranteed that the gate of the pass transistor would be at its maximum voltage at the critical time, then the circuit could be used with a reliable safety margin at lower values of supply voltage than is the case in the prior art.

DISCLOSURE OF INVENTION

The invention relates to a memory circuit that activates a pre-bootstrap charging circuit that is to be used for pre-charging the gate of a pass transistor in response to an input signal and then applies the pre-charge or pre-bootstrap signal to the pass transistor gate at a fixed relative time after the passage of the input signal that starts the memory cycle. The timing relationship of the several signals is such that the gates of the pass transistors in question are at their maximum voltage when the signal passes through.

A feature of the invention is the generation of a single pre-charge signal that is distributed about the integrated circuit.

Another feature of the invention is that the large value for the sum of the gate capacitance connected to the pre-charge circuit improves the retention time of the pre-charge voltage, thus increasing the tolerance on the timing of the various signals.

Another feature of the invention is that it permits the use of a small-area circuit for passing row select signals at a very constrained portion of the layout.

BEST MODE FOR CARRYING OUT THE INVENTION

Figure 1:
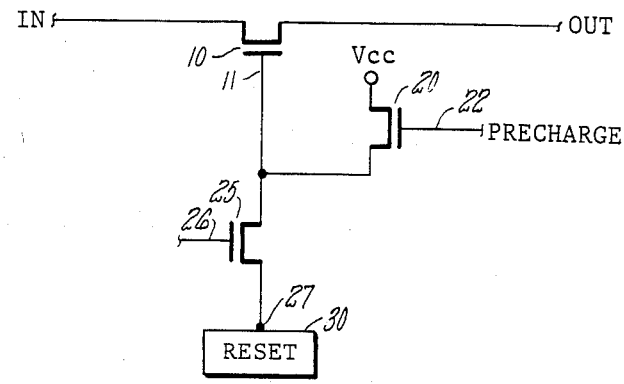
FIG. 1 illustrates a prior art circuit.

FIG. 1 illustrates a prior art pass transistor circuit. Transistor 10 receives a signal on the line IN and passes it through on the line OUT. It is important for the proper functioning of the circuit that the OUT signals have the same voltage swing as the IN signal, at least for a number of critical circuits. With enhancement transistors, this can only be achieved if the voltage on gate 11 rises sufficiently above the value Vcc. There are many ways to arrange for this, and one way that is commonly used is shown in FIG. 1. Precharge transistor 20 forms a path between Vcc and gate 11. Transistor 25 serves to isolate gate 11 from the capacitance of the reset circuit 30 so that the capacitance that must be charged during the bootstrap operation is as low as possible. The timing of the opening and closing of transistor 25 and the use of reset circuit 30 to discharge gate 11 to ground and thus to shut off transistor 10 are conventional and are widely known in the art. In the circuit indicated in FIG. 1, a precharge signal having a voltage of about 1.5 Vcc will be applied on gate 22 of transistor 20 after data has been read out in response to an interrogation. Gate 11 will rise to a value of Vcc, and then, after node 22 has discharged to Vcc or below via leakage, will fall in a time that is determined by the RC time constant associated with the capacitance of gate 11 and the resistance of whatever stray paths to ground there may be.

The drawback of this and other arrangements for pre-charging is that the time interval between memory accesses is unknown to the designer of the integrated circuit, but is set by the system in which the circuit is used. If the interval between memory accesses is long compared to the RC value, then the charge on node 11 leaks away and the bootstrap effect is of no use. The circuit will thus fail at a lower supply voltage than would be the case if the memory access interval were short. With the aid of the invention, the timing of the pre-charge pulse compared to the rest of the memory cycle is arranged such that the pre-charge bootstrap signal is reliably at its maximum value when it is needed.

It is convenient to summarize the operation on a dynamic RAM as: (1) Sense address; (2) Decode ROW; (3) Select ROW; (4) Sense Data; (5) Present Answer. As is known in the art, the ROW select step 3 is especially sensitive to a low value of Vcc because the ROW line is heavily loaded by the memory cells, so that a low impedance path into the ROW line is needed. That, in turn, requires that the row-select device be turned on hard.

Figure 2:
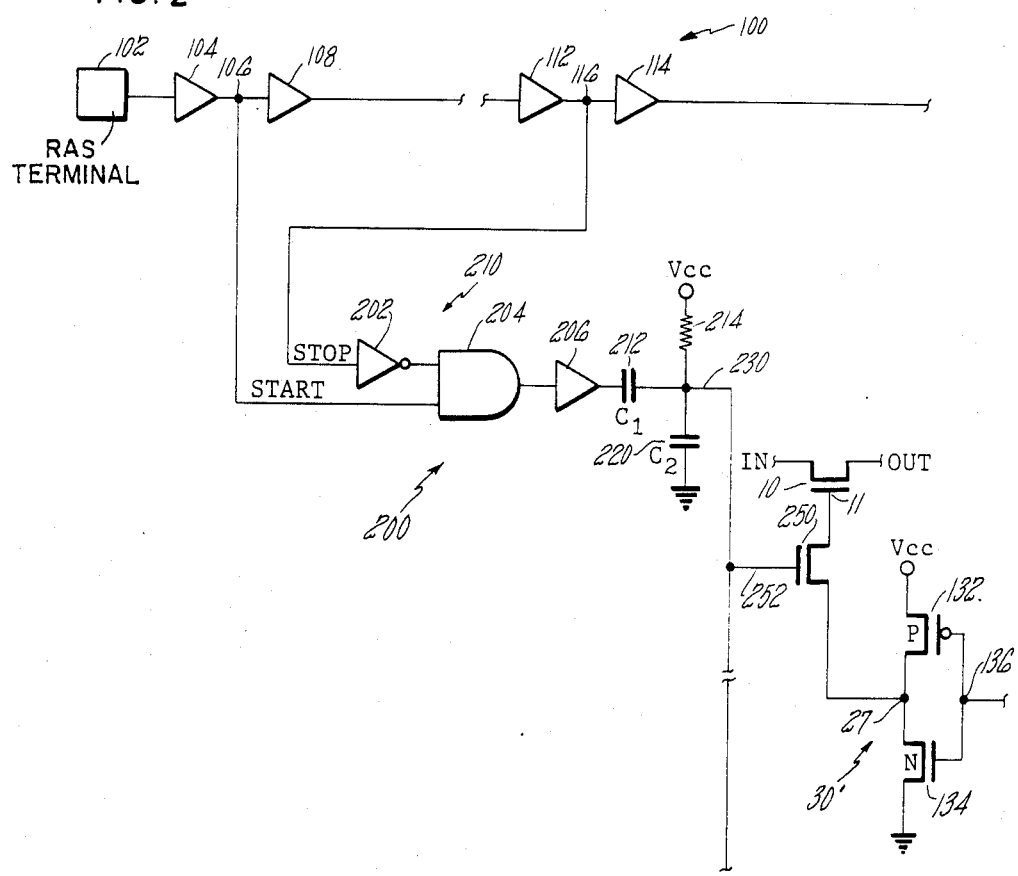
FIG. 2 illustrates a circuit constructed according to the invention.

The first step in the memory cycle, is, of course, to sense the address and the signal which is used to initiate the operation is conventionally referred to in the trade as $\overline{RAS}$ (Row Address Strobe). In FIG. 2, terminal 102 is the terminal that receives the $\overline{RAS}$ signal and is followed by a chain of buffers 104, 108, 112 and 114. The signal propagates through this buffer, or timing chain, which is used for timing as signals are tapped off at various points in the chain, to initiate different steps in the memory sequence. In particular, node 106 at the output of the first buffer 104 is fed to pulse-forming circuit 210, part of precharge circuit 200. The function of circuit 210 is to apply a high voltage at high current to capacitor C1 in order to boost node 230 above Vcc. As is known in the art, circuit 210 or its equivalent raises one terminal of capacitor 212 to a high voltage and then lowers the voltage of that terminal quickly in response to a turn-off signal from buffer 116. A positive pulse is then capacitively coupled into node 230 at the opposite terminal of capacitor 212. Node 230 has been charged to a value of Vcc, through resistor 214, in the interval between memory accesses. The voltage value of node 230, thus, will rise quickly to a value above Vcc that is determined by the relative magnitudes of capacitors 212 and 220, denoted by $C_1$ and $C_2$ respectively. $C_2$ represents the sum of the capacitance of all the bootstrap transistors connected to node 230. The stop signal to circuit 210 is shown as coming from node 116 at the output of buffer 112.

The length of time during which capacitor 212 is charged will depend upon the usual engineering tradeoffs and will vary with different circuits. The magnitude of capacitor 212 will be set to raise the voltage on node 230 to the value that is required. The time for the charging of capacitor 212 will be as short as possible consistent with the impedance of the circuit that drives capacitor 212. The buffer timing chain between buffer 108 and buffer 112 is shown as broken to indicate that no particular number of buffers is required in order to define the charging time.

Any number of circuits to accomplish the function of circuit 210 will be readily apparent to those skilled in the art. In the embodiment shown, AND gate 204 responds to one input from buffer 104 and an inverted input from inverter 112. Gate 204 is thus turned on and then off after a time interval that is set by the delay between the two inputs. Buffer 206 then pulses capacitor 212, as described above.

The pre-charge signal on node 230 is distributed about the integrated circuit to a number of gate control circuits, one of which includes transistor 250, having gate 252 connected to node 230 and reset circuit 30', having switching node 27 that is connected to gate 11 of pass transistor 10 by transistor 250. The voltage on node 230 is Vcc between pulses, so the corresponding steady state voltage on gate 11 will have a maximum value of Vcc-Vt. Circuit 30' charges up node 27 under control of a signal on node 136 that is preferably present before the precharge pulse arrives on gate 252 and, after the precharge signal has turned on transistor 250 sufficiently hard that it forms a path between node 27 and gate 11 that is capable of rising in voltage to Vcc, circuit 30' also charges gate 11 to Vcc.

The signals passing through transistor 10 are not specified. One particular signal will be the Row Select signal, the importance of which was noted above. Any number of other signals may also use the invention. It is an advantageous feature of the invention that the addition of pass transistors to node 230 (and thus the increase in the magnitude of the capacitance sum C2) serves as a benefit in that the RC time constant given by the value of resistor 214 and the value of C2 will be increased so that the time during which the bootstrap signal remains at a high value will be lengthened. A bootstrap signal that is generated and distributed as early as possible during the memory cycle will remain throughout the entire memory cycle.

Figure 3:
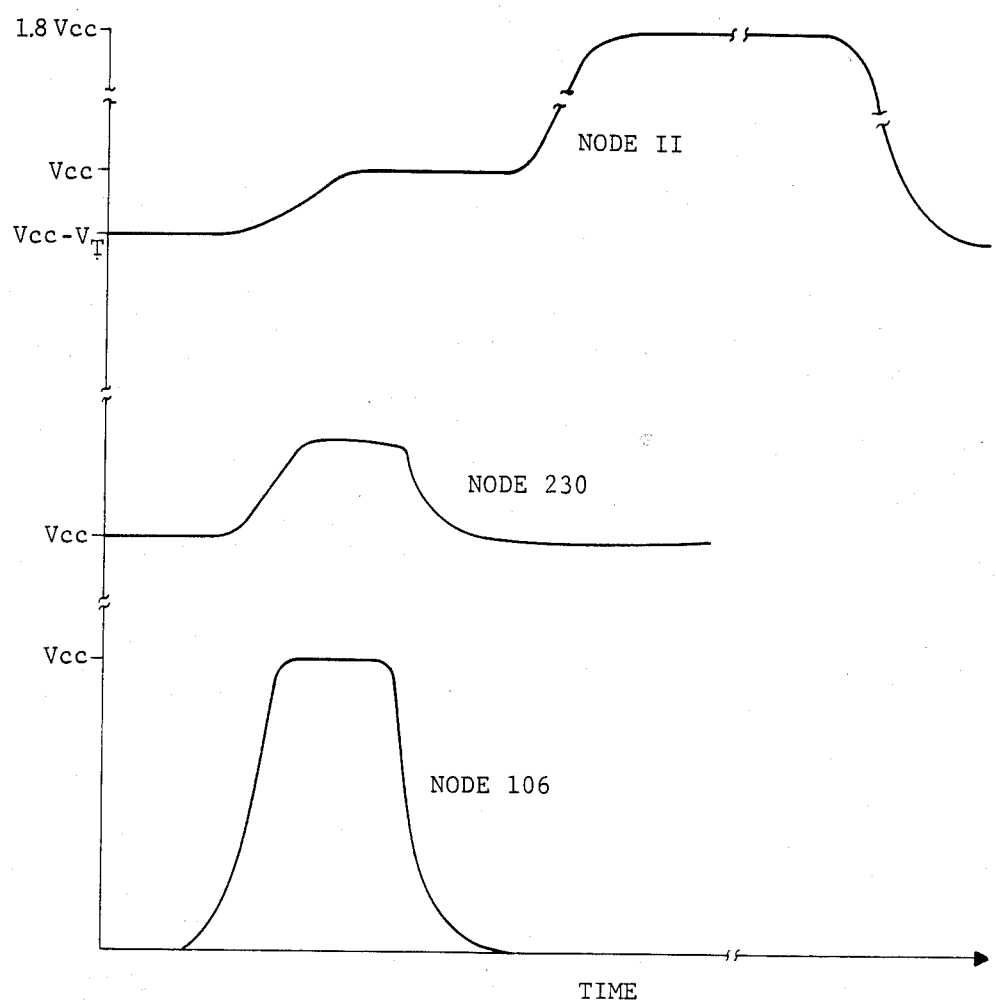
FIG. 3 illustrates the timing relationship of various signals involved in the circuit of FIG. 2.

The timing relationship among selected signals is illustrated in FIG. 3, in which the horizontal axis indicates increase in time and the vertical axis indicates voltage levels compared to Vcc. The input signal taken from node 106, which triggers the bootstrap signal on node 230, is illustrated as a conventional sharply peaked pulse. The signal on node 230 is shown as rising sharply shortly after the voltage on node 106 rises; "drooping" and then falling sharply as circuit 210 returns to a low state. In particular, the voltage on node 230 starts at a value of Vcc and rises to a value which is not specified in this diagram since it will depend on the relative magnitudes of capacitors of C1 and C2 according to the formula $$V_{230} = Vcc(1 + C_1/(C_1 + C_2))$$

In a preferred embodiment of the invention, the value of capacitor $C_1$ has a magnitude approximately twice the value of $C_2$ so that the voltage on node 230 rises to a value approximately 1.7 times Vcc. The drooping reflects the RC time constant of resistor 214 and the capacitance sum $C_1 + C_2$.

The ability of pass transistor 10 to function depends, of course, on the voltage on gate 11 which is shown on the top of FIG. 3 rising from a DC value of Vcc-Vt to the full value of Vcc that is assumed to be provided on node 27 as described below. The voltage on gate 11 begins to rise above the DC value as voltage on node 230 begins to rise and reaches a plateau value of Vcc (the DC value of the voltage on node 27) a time after the node 230 voltage is at its peak, the time being determined by the stray capacitance of nodes 27 and gate 11 together with the driving impedance of reset circuit 30'. The voltage on node 11 will then rise, in response to the bootstrapping effect of the IN signal at the source of transistor 10, to a final value of about 1.8 Vcc for modern transistors and remain high for the duration of the pulse being passed, falling back to the quiescent value of Vcc-Vt as the signal drops back to ground.

A suitable reset circuit is illustrated in FIG. 2, in which P-channel transistor 132 and N-channel transistor are connected between Vcc and ground, node 27 being the intermediate node between the transistors. Both transistor 132 and 134 are controlled by a common signal on node 136, with node 27 being essentially at Vcc or ground. Node 136 is held at ground, to supply Vcc at node 27, when node 11 is to be pre-charged and node 136 is raised to open a path to ground after the signal has passed through transistor 10 to discharge gate 11 and restore the normal condition in which IN and OUT are isolated by transistor 10. Overhead circuitry to accomplish these functions is conventional in the art and is omitted from the drawing. The timing of the signal on node 136 is not important, except for allowing sufficient tolerances to ensure that transistor 10 is not held up by the signal on node 136.

In a particular embodiment of the invention, the time between the falling edge of the $\overline{RAS}$ signal, that is the time reference for the start of the memory cycle, and the time at which a signal will pass through transistor 10 is nominally 40 nanoseconds and conservative engineering practice gives a minimum time by which the voltage on node 11 must reach the value Vcc as 25–30 nanoseconds. In this case also, the value of $C_1$ is 15 picofarads and the sum of the capacitance represented by $C_2$ is 8 picofarads. The rise time for the voltage on node 230 is only a few nanoseconds to reach a value of 1.5 times Vcc.

In one application of the invention, a series of transistors 10 are used to pass the row select signal in a dynamic RAM. In modern RAMs, the rows are set very close to one another, so that it is not possible to fit in any of a number of conventional circuits that would perform the function of passing a select signal with sufficient current and sufficiently quickly. With this invention, it is possible to put the relatively large circuitry at some convenient location and place only a single pass transistor in the confined area.

Those skilled in the art will readily be able to devise alternative embodiments of this invention in the light of the present disclosure. In particular, the timing of the pre-charge pulse on node 230 may be varied in order to make the pre-charge signal available as early as possible.

I claim:

1. A field-effect transistor circuit, employing only enhancement transistors, for controlling the passage of at least one controlled signal, after a first predetermined relative time, from an input terminal to an output terminal comprising:

at least one pass transistor having a pass transistor gate, an input node and an output node respectively connected to said input terminal and an output terminal, for passing to said input terminal to said output terminal;

receiving means for receiving a cycle-initiating signal;

pulse-forming means, responsive to said receiving means, for forming a precharge pulse signal having a predetermined duration and a precharge voltage magnitude greater than a power supply voltage magnitude, said precharge pulse signal reaching said precharge voltage magnitude said first predetermined relative time after said cycle-initiating signal;

distributing means for distributing said precharge pulse signal to at least one gate control means for controlling the voltage on said pass transistor gate in response to said precharge pulse signal, said gate control means including means for forming an electrical path, for raising said pass transistor gate to said power supply voltage magnitude, between a switching node and said pass transistor gate; and controllable current means, connected to said switching node, for supplying current at a voltage substantially equal to said supply voltage to said switching node at said predetermined relative time after said cycle-initiating signal has been received by said receiving means, whereby said pass transistor gate is brought substantially to said power supply voltage, and also for establishing a path from said pass transistor gate to ground at a second predetermined relative time after said first predetermined relative time.

2. A circuit according to claim 1, in which at least one of said pass transistors is connected to a row line of a memory array and said gate control means of said at least one pass transistor is located away from said row line, whereby only said pass transistor of said circuit is located close to said row line.

3. A circuit according to claim 1, in which said controllable current means within said gate control means includes a p-channel transistor connected between a power supply node and said switching node and an n-channel transistor connected between said switching node and ground, whereby current may be supplied to said switching node at said power supply voltage by the application of a low voltage to the gates of said p- and n- channel transistors.

* * * * *